United States Patent
El Sayed et al.

(10) Patent No.: US 10,685,163 B2
(45) Date of Patent: Jun. 16, 2020

(54) COMPUTATIONALLY EFFICIENT NANO-SCALE CONDUCTOR RESISTANCE MODEL

(71) Applicant: Synopsys, Inc., Mountain View, CA (US)

(72) Inventors: Karim El Sayed, Santa Clara, CA (US); Victor Moroz, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 159 days.

(21) Appl. No.: 15/905,719

(22) Filed: Feb. 26, 2018

(65) Prior Publication Data

US 2018/0253524 A1  Sep. 6, 2018

Related U.S. Application Data

(60) Provisional application No. 62/465,638, filed on Mar. 1, 2017.

(51) Int. Cl.
*G06F 17/50*      (2006.01)
*G06F 30/394*     (2020.01)
(Continued)

(52) U.S. Cl.
CPC ............ *G06F 30/394* (2020.01); *G06F 30/20* (2020.01); *G06F 30/367* (2020.01); *H01L 23/5226* (2013.01); *H01L 23/5228* (2013.01)

(58) Field of Classification Search
CPC ............ G06F 17/5077; G06F 17/5009; G06F 17/5036
(Continued)

(56) References Cited

U.S. PATENT DOCUMENTS 6,317,859 B1   11/2001  Papadopoulou
6,513,000 B1    1/2003  Toda
(Continued)

OTHER PUBLICATIONS

Huang et al. "Electrical properties of Cu nanowires," Nanotechnology, 2008. NANO'08. 8th IEEE Conference on. IEEE, 2008, 4 pages.

(Continued)

*Primary Examiner* — Suchin Parihar
(74) *Attorney, Agent, or Firm* — Haynes Beffel & Wolfeld LLP; Warren S. Wolfeld; Andrew L. Dunlap

(57) ABSTRACT

Disclosed is technology for evaluating the performance of various conducting structures in an integrated circuit. A three-dimensional circuit representation of a circuit design is provided. The three-dimensional circuit representation includes a plurality of conducting structures including a first conducting structure which has a length L. A plurality of longitudinally adjacent volume elements is identified in the conducting structure. A width $W_n$ and a height $H_n$ are estimated for each volume element n in the conducting structure. Furthermore, the local resistivity $\rho_n$ for each volume element n is estimated based on a function that is dependent upon the length L of the conducting structure and the width $W_n$ and height $H_n$ of the volume element n. The resistance of a conducting structure is estimated in dependence upon the resistivity $\rho_n$ for each of the volume elements n in the plurality of volume elements in the conducting structure.

19 Claims, 7 Drawing Sheets

(51) Int. Cl.
*G06F 30/20* (2020.01)
*G06F 30/367* (2020.01)
*H01L 23/522* (2006.01)

(58) Field of Classification Search
USPC ........................................................ 716/106
See application file for complete search history.

(56) References Cited

U.S. PATENT DOCUMENTS

| | | | |
|---|---|---|---|
| 8,468,482 B1* | 6/2013 | Pack | G06F 17/5036 716/110 |
| 8,483,997 B2 | 7/2013 | Li et al. | |
| 8,799,842 B2 | 8/2014 | Tutuianu et al. | |
| 8,856,710 B2 | 10/2014 | Yeh et al. | |
| 8,866,019 B2 | 10/2014 | Shinmoto et al. | |
| 9,231,209 B2 | 1/2016 | Mares et al. | |
| 9,245,079 B1 | 1/2016 | Huang et al. | |
| 9,658,508 B1 | 5/2017 | Bass et al. | |
| 9,717,144 B2 | 7/2017 | Sakajiri et al. | |
| 10,170,627 B2 | 1/2019 | Clifton et al. | |
| 10,360,338 B2 | 7/2019 | Cellier et al. | |
| 2001/0054509 A1 | 12/2001 | Fujikami et al. | |
| 2007/0143723 A1 | 6/2007 | Kawakami | |
| 2008/0082944 A1 | 4/2008 | Yamaguchi et al. | |
| 2008/0133185 A1 | 6/2008 | Suwada et al. | |
| 2009/0291514 A1 | 11/2009 | Asai | |
| 2009/0327983 A1 | 12/2009 | Li et al. | |
| 2010/0057411 A1 | 3/2010 | Li et al. | |
| 2010/0072460 A1 | 3/2010 | Bjoerk et al. | |
| 2010/0094609 A1 | 4/2010 | Han et al. | |
| 2010/0144535 A1* | 6/2010 | Strachan | B81C 1/00126 505/100 |
| 2011/0029295 A1 | 2/2011 | Okhmatovski et al. | |
| 2011/0072408 A1 | 3/2011 | Carmon et al. | |
| 2012/0065910 A1 | 3/2012 | Yoshino | |
| 2012/0311518 A1 | 12/2012 | Lu | |
| 2013/0162097 A1 | 6/2013 | Shinmoto et al. | |
| 2013/0341074 A1* | 12/2013 | Virkar | B82Y 30/00 174/255 |
| 2013/0342221 A1* | 12/2013 | Virkar | C09D 11/037 324/661 |
| 2014/0113828 A1 | 4/2014 | Gilbert et al. | |
| 2014/0258955 A1 | 9/2014 | Yen | |
| 2016/0070830 A1 | 3/2016 | Moroz et al. | |
| 2016/0136877 A1* | 5/2016 | Rogers | B29C 61/0616 428/174 |
| 2016/0342729 A1 | 11/2016 | Visvardis et al. | |
| 2017/0122998 A1 | 5/2017 | Liu et al. | |
| 2017/0344683 A1* | 11/2017 | Kamon | G06F 30/23 |
| 2017/0359072 A1* | 12/2017 | Hamilton | H03K 3/38 |
| 2018/0145184 A1* | 5/2018 | Clifton | H01L 29/0673 |
| 2018/0157783 A1* | 6/2018 | Moroz | G06F 30/327 |

OTHER PUBLICATIONS

Khanarian et al. "The optical and electrical properties of silver nanowire mesh films." Journal of applied physics 114.2 (2013): 14 pages.
Ciofi et al., "Modeling of Via Resistance for Advanced Technology Nodes." IEEE Transactions on Electron Devices 64.5 (2017): 2306-2313.
Gupta et al. "Integration scheme and 3D RC extractions of three-level supervia at 16 nm half-pitch." Microelectronic Engineering (2018), 4 pages.
Ciofi et al. "Impact of wire geometry on interconnect RC and circuit delay." IEEE Transactions on Electron Devices 63.6 (2016): 2488-2496.
TW 107106774—Voluntary Amendments filed Jun. 27, 2018, 49 pages.
EP 18159154.6—European Extended Search Report dated Jul. 6, 2018, 9 pages.
Faruk et al., "Variability Modeling and Process Optimization for the 32nm BEOL Using In-Line Scatterometry Data," IEEE Transactions on Semiconductor Manufacturing, vol. 27. No. 2, May 1, 2014, pp. 260-268.
Banerjee et al., "3-D ICs A Novel Chip Design for Improving Deep Submicrometer Interconnect Performance and Systems-on-Chip Integration," Proceedings of the IEEE, vol. 89 No. 5, May 1, 2001, pp. 602-633.
Gall, "Electron Mean Free Path in Elemental Metals." Journal of Applied Physics, 119(8) 2016, 5 pages.
Onuki et al., "Reduction in resistivity of 50 nm wide Cu wire by high heating rate and short time annealing utilizing misorientation energy," Journal of Applied Physics, 108(4), 2010, 7 pages.
U.S. Appl. No. 15/823,252—Office Action dated Aug. 5, 2019, 23 pages.
U.S. Appl. No. 15/823,252—Response to Office Action dated Aug. 5, 2019, filed Dec. 3, 2019, 11 pages.

* cited by examiner

COMPUTATIONALLY EFFICIENT NANO-SCALE CONDUCTOR RESISTANCE MODEL

CROSS-REFERENCE TO OTHER APPLICATIONS

This application claims priority under 35 U.S.C. § 119(e) to U.S. Provisional Application No. 62/465,638 filed on Mar. 1, 2017, the entire contents of which are hereby incorporated by reference herein.

FIELD OF THE INVENTION

This invention relates to the modeling of integrated circuit devices in computer-aided design (CAD) and electronic design automation (EDA) systems, and more specifically to modeling and simulating conductors in an integrated circuit (IC).

BACKGROUND

An integrated circuit (IC) is a set of electronic circuits that integrates a large number of semiconducting transistors into a small chip. Among the most advanced integrated circuits are microprocessors, memory chips, programmable logic sensors, power management circuits, etc. Advances in IC technology have led to size reduction of transistors, enabling greater densities of devices and circuits in IC chips and enhanced performance.

Metal wires have been used for IC interconnects since the invention of IC in early 70's. For the first several decades, the wires were manufactured with aluminum, but since the late 90's copper wires have been replacing aluminum for most of the ICs. Initially, due to the larger design rules, the wires were several microns wide. Currently, at 14 nm FinFET ICs, the copper interconnect wires on lower interconnect layers are about 30 nm wide. At the upcoming 7 nm and 5 nm technology nodes, the wire width is expected to reduce down to 15 nm, where ~4 nm are taken by barrier layers that sheath the copper, with just 11 nm left for the copper wire. At such wire widths, copper resistivity is expected to more than double with respect to bulk copper resistivity. Resistivity is sharply increasing with the wire width scaling due to the increased electron scattering at the copper interfaces and grain boundaries, and grain size is proportional to the wire width.

The increase in wire resistance leads to increased delay of signal propagation through the wire from one circuit block to the next. To mitigate it, circuit designers are using so-called via pillars which is a structure that contains several vias propagating a connection from transistors that are below metal 0 to the high metal layers, say metal 5 or metal 6. The wires at high metal layers are wider and therefore provide lower resistance and lower signal delay. However, wider wires mean that there are fewer such wires available to connect circuit elements to each other. Besides, the via pillars take a considerable area and therefore increase the cost of IC manufacturing. An accurate model to quantify different interconnect routing options is necessary to optimize the performance of each particular IC to achieve its spec requirements.

A simulation model has been developed for modeling resistance of an interconnect wire using a 3-D coordinate system as described in U.S. Non-Provisional application Ser. No. 15/823,252 filed on Nov. 27, 2017, the entire contents of which are hereby incorporated by reference herein. Roughly described, for each of a plurality of volume elements in the specified structure, the simulation model specifies a location and one a first and second materials of the interconnect having specified resistivities, and for each volume element generates a model resistivity for the volume element as a function of resistivity of volume elements within a neighborhood of the volume element and a specified transition region length $\lambda$. The model prefers accuracy over computational inefficiency as it assumes local metal resistivity inside the wire to be an exponential function of the distance from wire surface, with a characteristic length of about 3 nanometers. To be accurate with such a sharply varying function, very fine mesh spacing may be needed, which results in a large overall number of mesh points and a long computing time.

It is therefore desirable to provide an efficient simulation tool that can calculate the resistance of IC interconnects on a coarse mesh.

SUMMARY

Roughly described, a system and a method are provided that can be used to evaluate the resistance of various conducting structures of arbitrary shapes in an integrated circuit. Locations for a plurality of conducting structures in a three-dimensional circuit representation are provided to the system. The plurality of conducting structures includes a first conducting structure. The first conducting structure has a length L in a longitudinal dimension. Its width and height in two orthogonal dimensions orthogonal to the longitudinal dimension varies along the longitudinal dimension. A plurality of longitudinally adjacent volume elements are identified in the first conducting structure, and a width $W_n$ and a height $H_n$ are estimated for each volume element n in the plurality of volume elements. A resistivity $\rho_n$ is estimated for each of the volume elements n in the plurality of volume elements in the first conducting structure. The resistivity $\rho_n$ of a volume element n is a function of the length L of the first conducting structure, and the width $W_n$ and height $H_n$ of the volume element n. The resistance of the first conducting structure is estimated in dependence upon the resistivity $\rho_n$ for each of the volume elements n in the plurality of volume elements of the first conducting structure.

In some embodiments, the resistivity $\rho_n$ for each volume element n in the plurality of volume elements comprises estimating a single resistivity $\rho_n$ for the entire volume element n. In some embodiments, the first conducting structure comprises a core material and the resistivity $\rho_n$ of the volume element n in the first conducting structure is further dependent on material dependent parameters $\beta$ and $\alpha$, where the material dependent parameters $\beta$ and $\alpha$ are dependent upon the core material. In some embodiments, the core material of the first conducting structure is sheathed by a second material of the first conducting structure, and the material dependent parameters $\beta$ and $\alpha$ are further dependent upon the second material. In some embodiments, the material dependent parameters $\beta$ and $\alpha$ are further dependent upon the fabrication process of the first conducting structure.

In some embodiments, the resistance of the first conducting structure is estimated by calculating the local electric potential $\mu_n$ for each volume element n in the plurality of volume elements in dependence upon the resistivity $\rho_n$ of the volume element n by Laplace's equation, estimating current I through a first cross-section $S_A$ in dependence upon the resistivity $\rho_m$ and the local electric potential $\mu_m$ of each volume element m in a set of volume elements bounded by the first cross-section $S_A$, and estimating the resistance of the first conducting structure in dependence upon the current I and a difference between the voltage applied across the first conducting structure in the longitudinal dimension.

The method may be utilized to develop and optimize semiconductor processing technologies and devices. The method may be applied to various applications for nano-scale interconnects such as CMOS, power, memory, image sensors, solar cells, and analog/RF devices. In addition, the method may be utilized for interconnect modeling and extraction, providing critical parasitic information for optimizing chip performance.

The simulation may facilitate (1) the analysis of complex on-chip, nano-scale interconnect structures and the influence of process variation, the creation of a parasitic database for both foundries and designers to study the effect of design rule change, (3) the generation of accurate capacitance rules for Parasitic RC Extraction (PEX) tools, (4) creating and analyzing arbitrary and complex 3D shapes using standard CAD operations or process emulation steps, and (5) visualization of output characteristics such as the potential distribution inside complex 3D shapes.

One or more embodiments of the invention or elements thereof can be implemented in the form of a computer product including a non-transitory computer readable storage medium with computer usable program code for performing the method steps indicated. Furthermore, one or more embodiments of the invention or elements thereof can be implemented in the form of an apparatus including a memory and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a computer readable storage medium (or multiple such media).

These and other features, aspects, and advantages of the invention will become apparent from the following detailed description of illustrative embodiments thereof, which is to be read in connection with the accompanying drawings.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein. A detailed description of embodiments of the present invention is provided with reference to the FIGS. 1-7.

Figure 1:
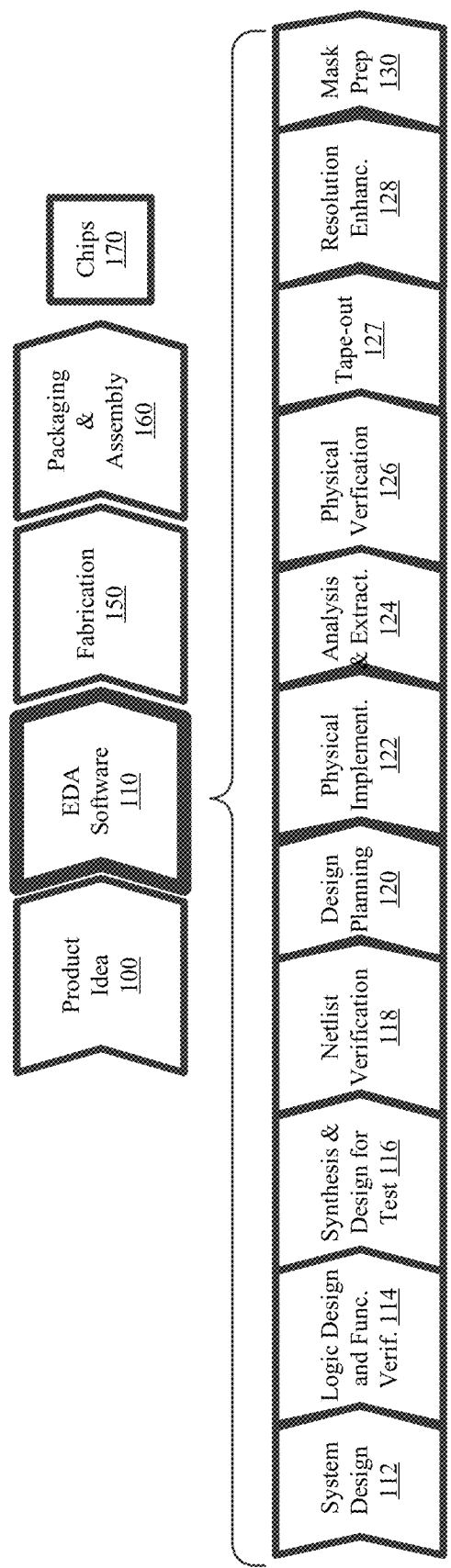
FIG. 1 illustrates EDA tools and process flow for integrated circuit design and manufacturing.

Aspects of the invention can be used to support an integrated circuit design flow. FIG. 1 shows a simplified representation of an illustrative digital integrated circuit design flow. At a high level, the process starts with the product idea (step 100) and is realized in an EDA (Electronic Design Automation) software design process (step 110). When the design is finalized, it can be taped-out (step 127). At some point after tape out, the fabrication process (step 150) and packaging and assembly processes (step 160) occur resulting, ultimately, in finished integrated circuit chips (result 170).

The EDA software design process (step 110) is itself composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, System Studio, and DesignWare® products.

Logic design and functional verification (step 114): At this stage, the VHDL or Verilog code for modules in the system is written, and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and Custom Designer products.

Physical implementation (step 122): The placement (positioning of circuit elements) and routing (connection of the same) occurs at this step, as can selection of library cells to perform specified logic functions. Example EDA software products from Synopsys, Inc. that can be used at this step include the Astro, IC Compiler, and Custom Designer products.

Analysis and extraction (step 124): At this step, the circuit function is verified at a transistor level, this, in turn, permits what-if refinement. Example EDA software products from Synopsys, Inc. that can be used at this step include Astro-Rail, PrimeRail, PrimeTime, and Star-RCXT products.

Physical verification (step 126): At this step, various checking functions are performed to ensure correctness for manufacturing, electrical issues, lithographic issues, and circuitry. Example EDA software products from Synopsys, Inc. that can be used at this step include the Hercules product.

Tape-out (step 127): This step provides the "tape out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides mask-making-ready "tape-out" data for production of masks for lithographic use to produce finished chips. Example EDA software products from Synopsys, Inc. that can be used at this step include the CATS(R) family of products. The method for actually making the masks can use any mask making technique, either known today or developed in the future. As an example, masks can be printed using techniques set forth in U.S. Pat. Nos. 6,096,458; 6,057,063; 5,246,800; 5,472,814; and 5,702,847, all incorporated by referenced herein for their teachings of mask printing techniques.

Once the process flow is ready, it can be used for manufacturing multiple circuit designs coming from various designers in various companies. The EDA flow 112-130 will be used by such designers. A combination of the process flow and the masks made from step 130 are used to manufacture any particular circuit.

A Design Technology Co-Optimization (DTCO) process flow provides a simulation flow that enables technology development and design teams to evaluate various transistors, interconnects and process options using a design and technology co-optimization methodology that starts in the pre-wafer research phase. Using techniques described herein, the DTCO process flow may take into account parasitic interconnect resistance of various conductors or interconnects in an IC. The DTCO process flow can be used to evaluate the performance, power, area, and cost of a new or significantly modified IC fabrication technology, including interconnect fabrication technology. Achieving transistor performance and power targets of new IC technology requires consideration of new material options for interconnects, and sometimes also new interconnect mapping in the IC. Parasitic resistances of interconnects are taken into account during the performance evaluation of the new technology.

Figure 2:
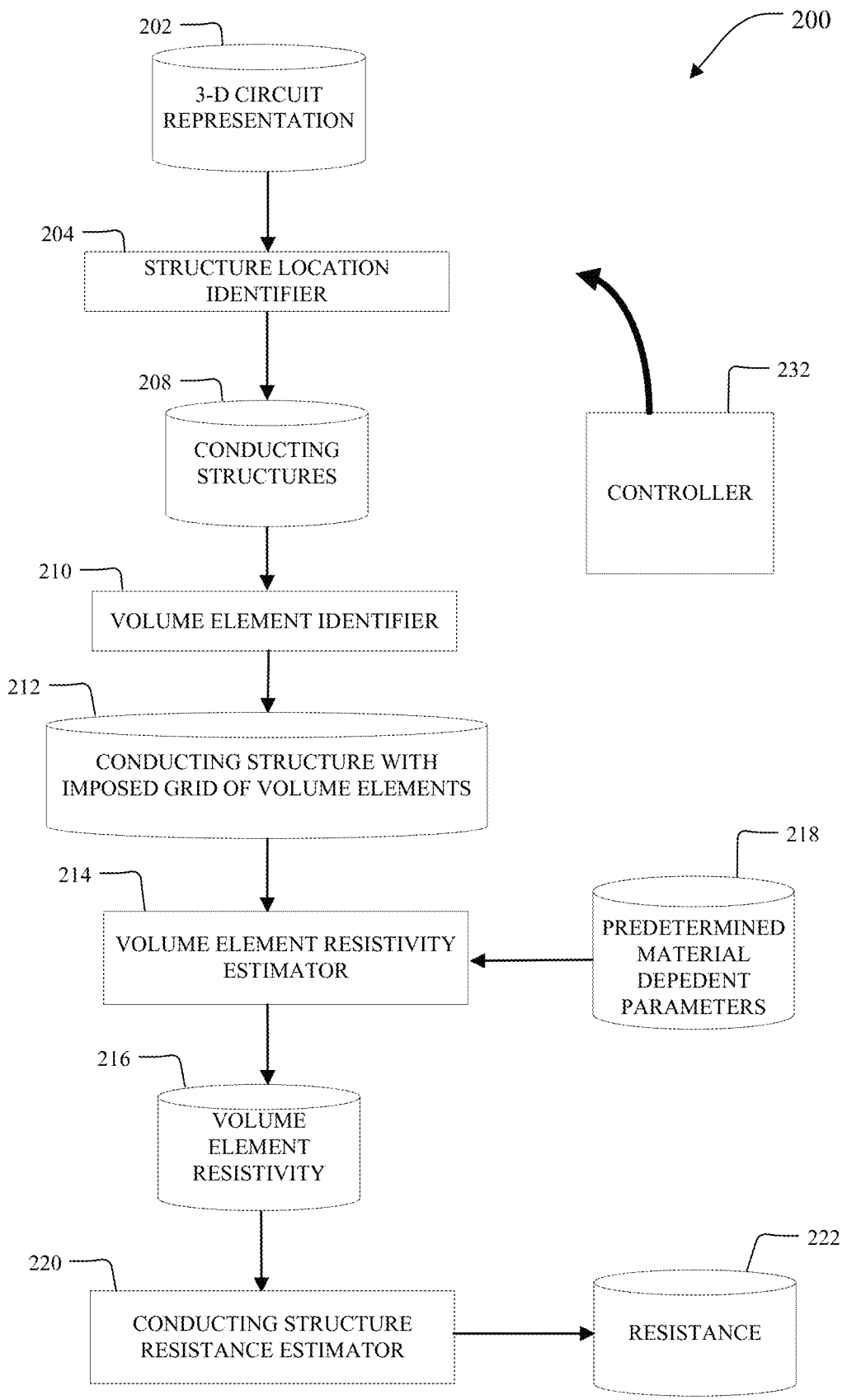
FIG. 2 illustrates a flowchart detail of a conducting structure simulation system in accordance with one embodiment.

FIG. 2 illustrates a flowchart detail of a conducting structure simulation system 200 according to aspects of the invention. The conducting structure simulation system 200 starts with a 3-D circuit representation in database 202. As used herein, no distinction is intended between whether a database is disposed "on" or "in" a computer readable medium. Additionally, as used herein, the term "database" does not necessarily imply any unity of structure. For example, two or more separate databases, when considered together, still constitute a "database" as that term is used herein. Thus in FIG. 2, the databases 202 can be a single combination database, or a combination of two or more separate databases. The databases 202 can be stored on a hard drive, a storage device or in a memory location or in one or more non-transitory computer readable media.

The 3-D circuit representation 202 represents a circuit design. The 3-D circuit representation 202 indicates the surfaces and interfaces among different components and materials in the circuit design, and takes account of line edge variation and corner rounding from photolithographic patterning and etching. The circuit design may include any combination of electronic devices, pins and interconnects. Electronic devices are components for controlling the flow of electrical currents for the purpose of information processing, information storage, and system control. Examples of electronic devices include transistors, diodes, capacitors, and tunnel junctions. Electronic devices are connected to the circuit through their terminals, e.g., the gate, source, and drain of a transistor. Pins in the circuit design pass signals from and to other circuit designs and power supply lines. Transistors and pins in a circuit design are connected through metallic conductors referred to herein as interconnects, where the transistor terminals and pins act as the endpoints of interconnects.

Interconnects in an IC can span several layers, each layer separated from the previous layer by a dielectric. Where interconnections are required from one layer to another, an opening is formed through the intervening dielectric layer and filled with a conductive material. There are many variations on this structure. The interconnections between layers sometimes are referred to as 'vias' if they interconnect two metal interconnect layers. The interconnections between layers sometimes are referred to as 'contacts' if they connect the first metal interconnect layer to the silicon or gate layers in transistors. The first layer of metal is referred to herein as "metal 0", or M0 for short. For simplicity of discussion, no distinction is made herein between 'contacts' and 'vias,' and the two terms are used interchangeably herein. During fabrication, the M0 layer is formed over the underlying dielectric and then patterned to form individual conductors. The next dielectric layer is then formed above M0, vias are opened as required in this layer, and then a Metal 1 (M1) layer is formed and patterned. This process continues on up through M3, M4, and so on to the highest metal layer.

The 3-D circuit representation 202 includes at least one conducting structure. As used herein, "conducting structure"

is a broader term than "interconnect." Not all "conducting structures" are interconnects because a design might include a conducting structure which does not interconnect one terminal or pin to another. A conducting structure comprises a core material. The core material is the innermost material of the conducting structure. In some embodiments, the core material can be the entire conducting structure. In some embodiments, the core material can be sheathed by a second material. If the second material is a conductor, it is considered herein to be a part of the same "conducting structure" or interconnect as the core material.

Figure 3:
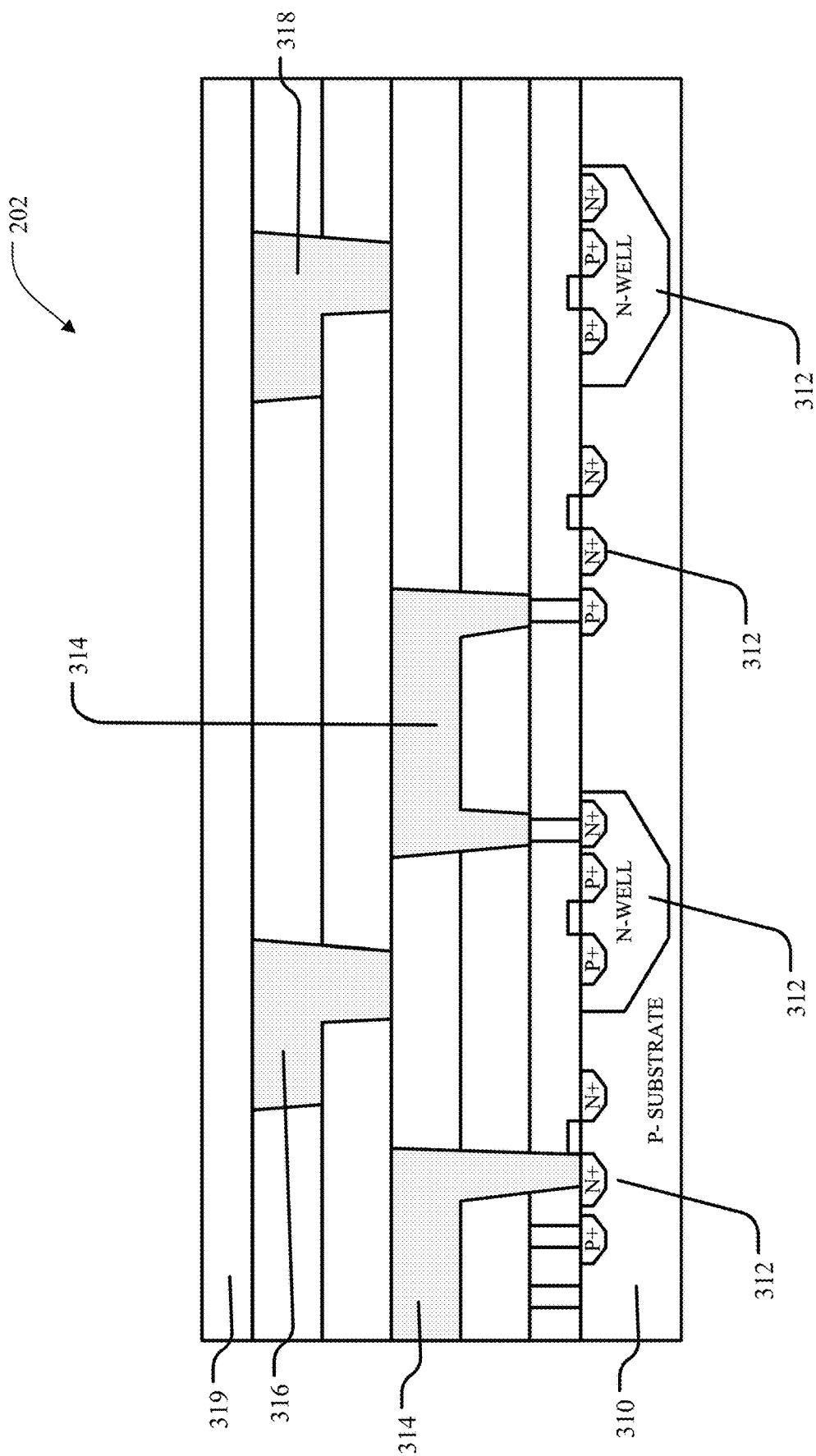
FIG. 3 illustrates a cross-section of a 3-D circuit representation.

FIG. 3 illustrates a cross-section of an example 3-D circuit representation 202. The various features illustrated in FIG. 3 are symbolic and do not necessarily represent an actual device. As shown in FIG. 3, the 3-D circuit representation 202 includes a substrate 310, a plurality of active devices 312, and a top passivation layer 319. The 3-D circuit representation further includes a plurality of conducting structures, such as interconnect layers 314, and first and second contacts 316, 318. The conducting structures may be superconducting (e.g., the structure may comprise of a core material such as YBCO), or metallic (e.g., the structure may comprise of a core material such as Ni, Pt, Au, Cu, Al, Ru, W). In some embodiments, the conducting structure may be sheathed by a second dielectric layer (e.g., SiO2, TiO2). In some embodiments, the conducting structure may be semiconducting (e.g., Si, InP, GaN). In some embodiments, the conducting structures can be nanowires. Nanowires can be present in electronic, optoelectronic and nano-electromechanical devices, nanoscale quantum devices, field-emitters and biomolecular nanosensors. Therefore, a 3-D circuit representation of any of the devices mentioned above can be used as an input for the conducting structure simulation system 200.

Referring to FIG. 2, the structure location identifier 204 identifies various conducting structures in the 3-D circuit representation 202. For the 3-D circuit representation 202 in FIG. 3, at least one conducting structure is identified from the plurality of conducting structures, such as interconnect layers 314, and first and second contacts 316, 318. In some embodiments, the structure location identifier 204 may identify a part of a conductor as a conducting structure. In other embodiments, the structure location identifier 204 may identify the entire conductor as a conducting structure. The structure location identifier 204 outputs the identified conducting structures to a conducting structure database 208.

Figure 4:
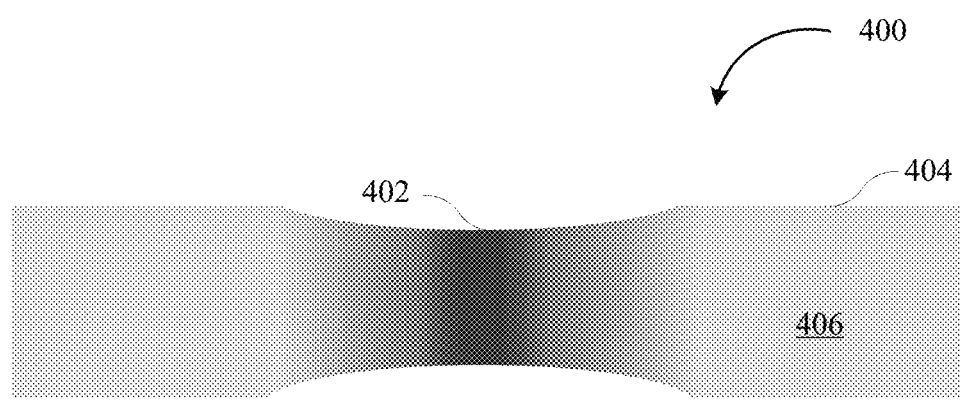
FIG. 4 illustrates a resistivity distribution for a conducting structure with varying height and local resistivity shown along the structure surfaces.

FIG. 4 illustrates an example of a distorted conducting structure with varying local resistivity 406 shown along the structure surfaces. The conducting structure of FIG. 4 may be, for example, one of the conducting segments 314, 316, 318 in FIG. 3, excluding any vias. The distortion in the conducting structure causes variances in the width and height of the metal interconnect along the length of the wire. In the embodiment of FIG. 4 the width dimension is perpendicular to the page and only the height varies. Resistivity is represented in grayscale. The darkest shade represents the highest resistivity area in the wire. The lightest shade represents the lowest resistivity area in the wire. Local resistivity increases towards the narrower parts 402 of the wire. Metal resistivity is lowest in the wider part 404 of the wire.

Figure 5A:
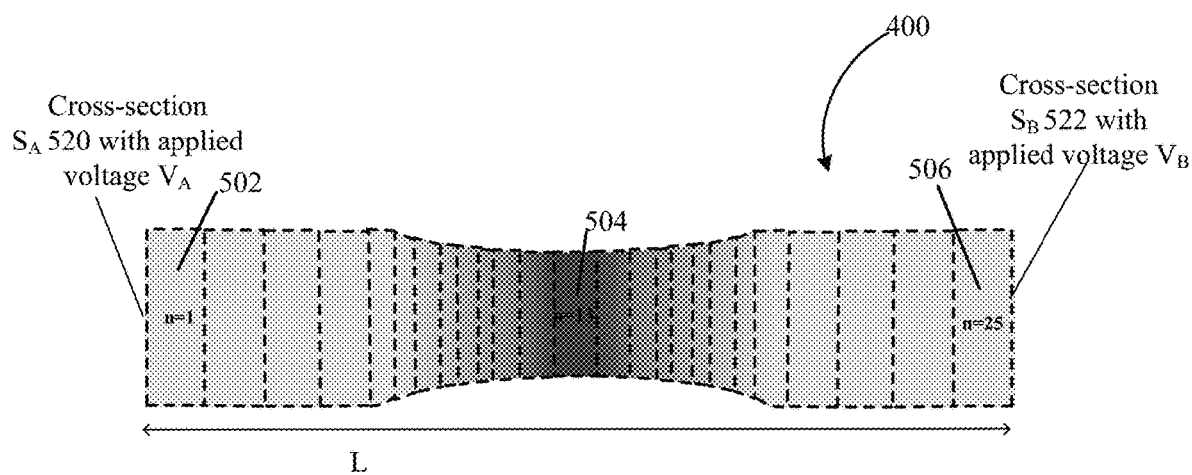
FIG. 5 (including FIGS. 5A, 5B, and 5C collectively) illustrates volume element features useful for explaining a method of operation of the conducting structure simulation system for the conducting structure in FIG. 4 as an input.

Referring to FIG. 2, identified conducting structures in database 208, such as the conducting structure 400, are provided to a volume element identifier 210. The volume element identifier 210 may also receive any parameters to be used in generating volume elements in a conducting structure. The volume element identifier 210 creates a grid of volume elements in the conducting structure to be modeled. A volume element data structure is populated for each volume element, which includes an indication of the position of the grid volume element in the conducting structure (in three dimensions), and values for various properties of the conducting structure at that volume element. In some embodiments, the volume elements may be cross-section volumes of the conducting structure as illustrated in FIG. 5A. It will be evident to a person skilled in the art that various modifications of the shape of the volume element may be made within the scope of the invention. In some embodiments, volume elements in a conducting structure can be of arbitrary shapes. However, the volume elements are longitudinally adjacent to each other as to form a continuous longitudinal conducting path spanning the two surfaces of the conducting structure across which the resistance is to be estimated.

Figures 5B, 5C:
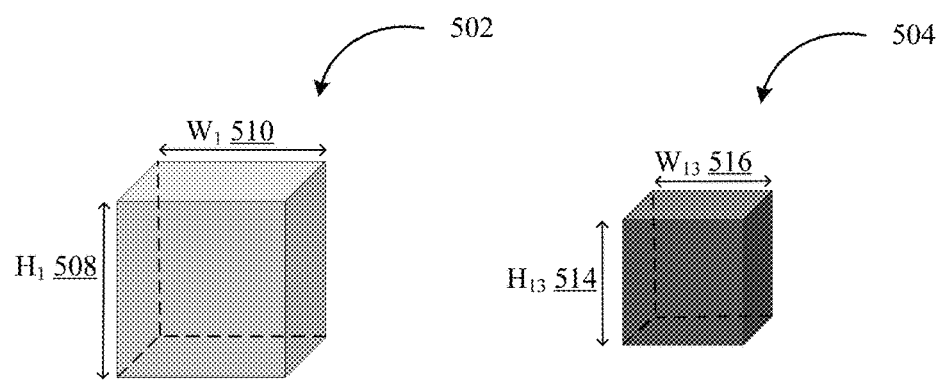

The volume element identifier 210 outputs a grid of volume elements 212. An example grid of volume elements is illustrated in FIG. 5A. Twenty-five volume elements (n=1, 2, 3 . . . 25) define the conducting structure 400. Each volume element in the conducting structure 400 is associated with a local resistivity in the embodiment in FIG. 5A. A volume element 502 numbered n=1 (FIG. 5B) and a volume element 506 number n=25 are located at the two longitudinally opposite ends of the conducting structure 400. Volume elements 1 and 25 have the lowest local resistivity. Volume element 13 (504 in FIG. 5C) in the middle has the highest local resistivity. In some embodiments, resistivity is assumed to be uniform within a volume element. Each volume element is also associated with a width $W_n$ and a height $H_n$. As shown in FIG. 5B, volume element 1 (n=1) has a width $W_1$ 510 and a height $H_1$ 508, and as shown in FIG. 6C, volume element 13 (n=13) has a width $W_{13}$ 516 and a height $H_{13}$ 514. Although the longitudinal dimension in FIG. 5A is shown as being the same as the longest dimension of the conductive structure, that is not necessary in all embodiments. In another embodiment the longitudinal dimension may be chosen as the dimension that appears vertical in the drawing, and in yet another embodiment the longitudinal dimension may be chosen as a diagonal of the structure in the drawing. In each embodiment, the length L is the length of the structure in whatever dimension is defined as the longitudinal dimension, and the width and height dimensions are adjusted accordingly.

Referring to FIG. 2, the grid of volume elements 212 is provided to the volume element resistivity estimator 214. Material dependent parameters 218 are also provided to the volume element resistivity estimator 214. Material dependent parameters may include bulk resistivity $\rho_{bulk}$ of the core material of the conducting structure, a fitting parameter $\beta$ (Ohm nm), and a fitting parameter $\alpha$ (dimensionless). The material dependent parameters, such as fitting parameter $\beta$ and $\alpha$, may be dependent on the core material of the conducting structure and may be further dependent on the sheathing second barrier layer. The material dependent parameters $\beta$ and $\alpha$ may also be dependent on the fabrication process of the conducting structure. The volume element resistivity estimator 214 is phenomenological in nature, meaning that it may not predict behavior of arbitrary new materials and involves calibration to provided data. Once the model is calibrated to a set of reference test structures, it may be applied to a variety of conducting structures with tapered sidewalls and lithography distorted shapes. A model calibrated to simple reference structures for wire sizes scaled towards the future technology volume elements may be applied to predict the physical behavior of the future interconnect conducting structures.

The volume element resistivity estimator 214 estimates the local resistivity $\rho_n$ at each volume element n in the grid of volume elements for the conducting structure. The local resistivity $\rho_n$ is calculated according to the following expression:

$$\rho_n = \max((\beta L^\alpha + \beta W_n^\alpha + \beta H_n^\alpha), \rho_{bulk}) \quad \text{Equation (1)}$$

where L is the length of the conducting structure in the longitudinal dimension, $W_n$ is the volume element width for volume element n, and $H_n$ is the volume element height for volume element n. L, $W_n$, and $H_n$ are greater than zero in Equation 1. $\rho_{bulk}$ is the bulk resistivity of the core material of the conducting structure. In some embodiments, functions of other forms of function dependent on L, $W_n$ and $H_n$ can model the local volume element resistivity $\rho_n$. Some functions will work better than Equation (1), while some functions may not. For some functions, the fit may be better in some circumstances than others. In general, an equation of the following form can be used in place of Equation (1):

$$\rho_n = f(L, W_n, H_n) \quad \text{Equation (2)}$$

where $f$ is a chosen function.

Equation (1) can be applied to available experimental data, and a curve fitting method can be used to extract parameters $\beta$ and $\alpha$ for the specific material and fabrication process to be stored in material dependent parameter database 218. Such calibration is done for the data that is available, which is often measured resistances for a set of conducting structures with various dimensions. Once the model is calibrated to a specific material and fabrication process, it should handle different sizes and different aspect ratios of conducting structures.

The volume element resistivity estimator 214 provides the output volume element resistivity 216 for each volume element in the grid of volume element 212 of the conducting structure 208 to the conducting structure resistance estimator 220.

The conducting structure resistance estimator 220 estimates the resistance 222 of the conducting structure 208. The total resistance introduced by the conducting structure from a point A in the conducting structure to a point B in the conducting structure can be calculated by estimating the current I flowing through the conducting structure at any cross-section of the wire between point A and point B. Let point A be the first cross-section $S_A$ 520 with a first voltage $V_A$ and point B be a second cross-section $S_B$ 522 with a second voltage $V_B$ as illustrated in FIG. 5. $S_A$ and $S_B$ are at opposite ends of the first conducting structure longitudinally. The local electric potential $\mu_n$ of any volume bounded by the first cross-section $S_A$ is the first voltage $V_A$ and the local electric potential $\mu_n$ of any volume element bounded by the second cross-section $S_A$ is the second voltage $V_B$. Therefore, volume element 1 of the conducting structure 400 will have a local resistivity $\mu_1$ of first voltage $V_A$, and volume element 25 will have a local resistivity $\mu_{25}$ of second voltage $V_B$.

At each volume element n in the grid of volume elements between first cross-section $S_A$ and second cross-section $S_B$, local electric potential $\mu_n$ can be calculated using Laplace's equation:

$$\nabla G_n \cdot \nabla \mu_n = \nabla \left(\frac{1}{\rho_n}\right) \cdot \nabla \mu_n = 0 \quad \text{Equation (3)}$$

where $G_n$ is the conductivity of volume element n and is the inverse of the local resistivity $\rho_n$. The boundary conditions for the Laplace's equation are the electric potentials or voltages, $V_A$ and $V_B$, applied at the volume elements in the first cross-section $S_A$ 520 and second cross-section $S_B$ 522 respectively.

The current I flowing at the cross-section $S_A$ can be calculated by integrating local conductivities in the volume elements bounded by cross-section $S_A$:

$$I = \int_{m \text{ in } S_A} G_m \nabla \mu_m dS_A = \int_{m \text{ in } S_A} (1/\rho_m) \nabla \mu_m dS_A \quad \text{Equation (4)}$$

The current I flowing at the cross-section $S_B$ is equal to the current flowing at the cross-section $S_A$.

The total resistance introduced by the wire from cross-section $S_A$ in the wire to cross-section $S_B$ in the wire can be calculated from the electric potential or voltage difference between the two cross-sections ($V = V_A - V_B$) in the wire and the current I flowing at the cross-section $S_A$ of point A or cross-section $S_B$ of point B. The resistance is given by R=V/I.

The resistance 222 may be provided to a user by a reporting module. In one embodiment the resistance 222 is written to a non-transitory computer readable medium such as a disk drive, a storage device or computer memory, and in a further embodiment the resistance 222 can be provided to a visualization module which presents the distribution of the resistances across the conducting structures in the 3-D circuit representation 202 in a visual form which simplifies user interpretation of the results.

The resistance 222 is then used, in various embodiments, for a variety of real-world aspects of building or improving integrated circuit devices. In one embodiment, for example, the results are used to develop or improve a fabrication process flow for conductors in an IC. In another embodiment, the resistance 222 is used to characterize or improve interconnects, vias, contact pads and nanowires. In other embodiments, the results are used to develop HSPICE models of the integrated circuit devices, in order to enable designers to develop better circuit designs and layouts. In yet other embodiments the results are used to improve process flow to achieve the desired transistor and capacitor performance. Thus the resistance 222 obtained by the methods and systems described herein are used for real-world technological development or implementation of semiconductor manufacturing processes or circuit designs.

Referring to FIG. 2, the sequence of operation of the structure location identifier 204, the volume element identifier 210, the volume element resistivity estimator 214, and the conducting structure resistance estimator 220 can be controlled automatically by a flow controller 232. Flow controller 232 may be a module that executes scripts to call each of the individual processing modules in the sequence set forth in FIG. 2, and defines the data flow among them. Flow controller 232 may be implemented, for example, with Sentaurus Workbench, available from Synopsys, Inc.

Figure 6:
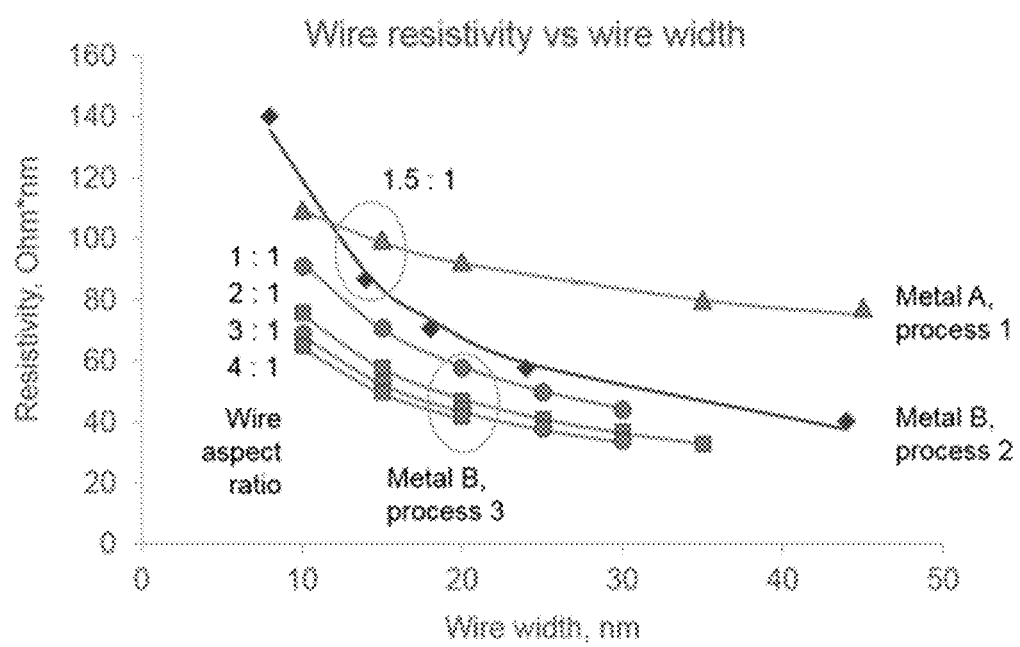
FIG. 6 illustrates the ability of the conducting structure simulation system to describe various available narrow wire resistance data.

FIG. 6 illustrates the effectiveness of Equation (1) in estimating local resistivity. FIG. 6 is a plot illustrating how the equation is used to extract fitting parameters $\beta$ and $\alpha$ for a number of metals, fabrication process and conducting structure cross-section aspect ratio combinations: (i) metal A, fabrication process 1, and conducting structure cross-section aspect ratio of 1.5:1, (ii) metal B, fabrication process 2 and conducting structure cross-section aspect ratio of 1.5:1, and (iii) metal B, fabrication process 3, and conducting structure cross-section aspect ratios of 1:1, 2:1, 3:1, and 4:1. The markers indicate experimental data while the lines represent data from the model. Once the model is calibrated to a specific metal and fabrication process, the model can typically handle different conducting structure sizes and conducting structure cross-section aspect ratios with the calibrated parameters β and α. It can be seen that the equation predicts resistivities that are very close to the observed data. Equation (1) can be accurate even for absurdly coarse mesh as long as the conducting structure geometry is represented properly. For realistic geometries that include wire shape distortions due to such phenomena as optical proximity effects, etch micro-loading, and line edge roughness, the structure should have at least enough mesh points to accurately represent the geometry. And that should be enough for the model herein to provide accurate wire resistivity calculation.

Figure 7:
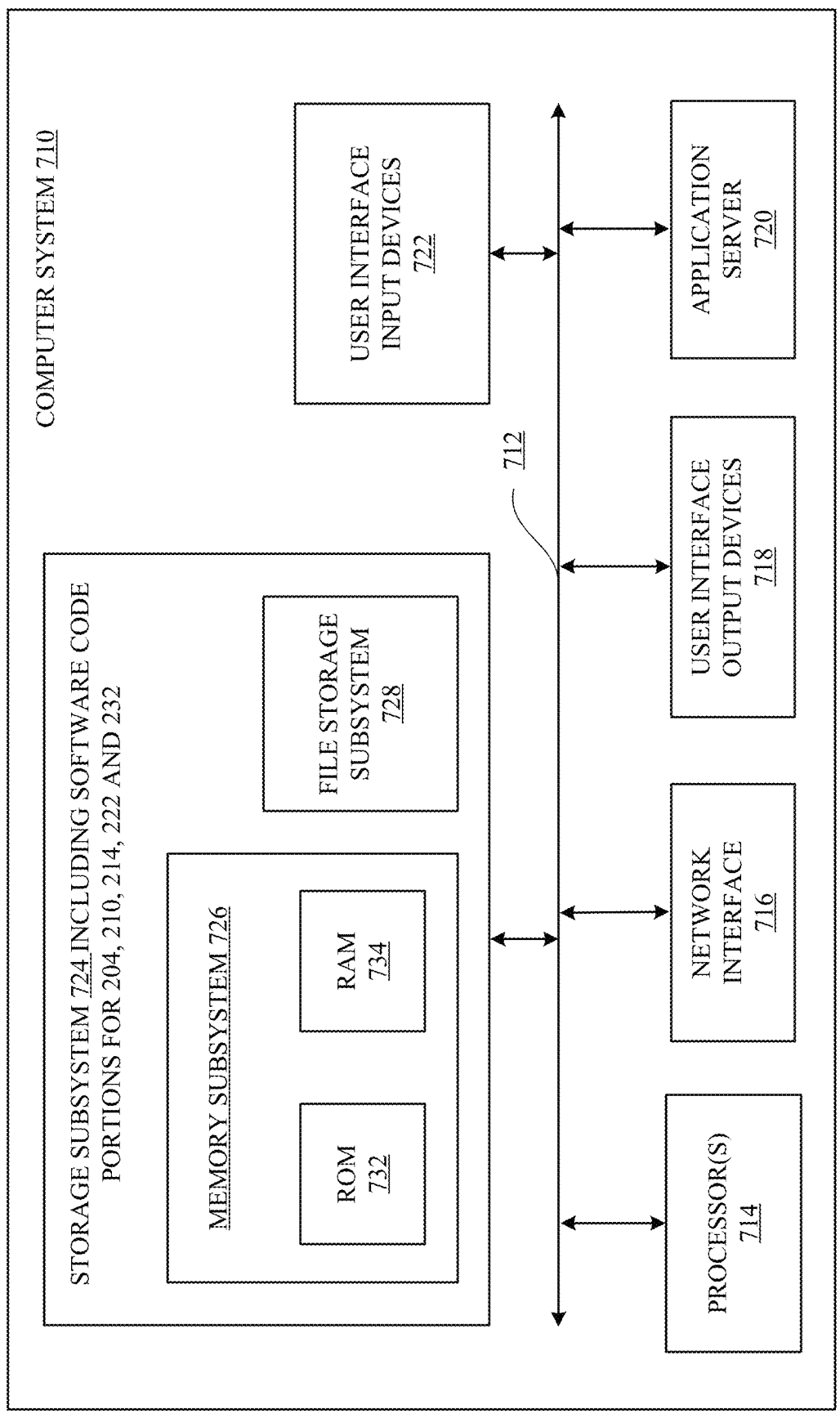
FIG. 7 is a simplified block diagram of a computer system that incorporates aspects of the invention.

FIG. 7 is a simplified block diagram of a computer system 710 that can be used to implement any of the methods herein. Particularly it can be used to implement modules 204, 210, 214, 216, 222, and/or 232 in various embodiments. It also includes or accesses the databases 202, 208, 212, 216, 218, and/or 222.

Computer system 710 typically includes a processor subsystem 714 which communicates with a number of peripheral devices via bus subsystem 712. These peripheral devices may include a storage subsystem 724, comprising a memory subsystem 726 and a file storage subsystem 728, user interface input devices 722, user interface output devices 720, and a network interface subsystem 716. The input and output devices allow user interaction with computer system 710. Network interface subsystem 716 provides an interface to outside networks, including an interface to the communication network 718, and is coupled via communication network 718 to corresponding interface devices in other computer systems. Communication network 718 may comprise many interconnected computer systems and communication links. These communication links may be wireline links, optical links, wireless links, or any other mechanisms for communication of information, but typically it is an IP-based communication network. While in one embodiment, communication network 718 is the Internet, in other embodiments, communication network 718 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 722 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 710 or onto computer network 718.

User interface output devices 720 may include a display subsystem, a printer, a fax machine, or non-visual displays such as audio output devices. The display subsystem may include a cathode ray tube (CRT), a flat panel device such as a liquid crystal display (LCD), a projection device, or some other mechanism for creating a visible image. The display subsystem may also provide a nonvisual display such as via audio output devices. In general, use of the term "output device" is intended to include all possible types of devices and ways to output information from computer system 710 to the user or to another machine or computer system.

Storage subsystem 724 stores the basic programming and data constructs that provide the functionality of certain embodiments of the present invention. For example, the various modules implementing the functionality of certain embodiments of the invention may be stored in storage subsystem 724. These software modules are generally executed by processor subsystem 714. The databases 202, 208, 212, 216, 218, and/or 222 may reside in storage subsystem 724.

Memory subsystem 726 typically includes a number of memories including a main random access memory (RAM) 734 for storage of instructions and data during program execution and a read-only memory (ROM) 732 in which fixed instructions are stored. File storage subsystem 728 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 728. The host memory 726 contains, among other things, computer instructions which, when executed by the processor subsystem 714, cause the computer system to operate or perform functions as described herein. As used herein, processes and software that are said to run in or on "the host" or "the computer," execute on the processor subsystem 714 in response to computer instructions and data in the host memory subsystem 726 including any other local or remote storage for such instructions and data.

Bus subsystem 712 provides a mechanism for letting the various components and subsystems of computer system 710 communicate with each other as intended. Although bus subsystem 712 is shown schematically as a single bus, alternative embodiments of the bus subsystem may use multiple busses.

Computer system 710 itself can be of varying types including a personal computer, a portable computer, a workstation, a computer terminal, a network computer, a television, a mainframe, a server farm, or any other data processing system or user device. Due to the ever-changing nature of computers and networks, the description of computer system 710 depicted in FIG. 7 is intended only as a specific example for purposes of illustrating the preferred embodiments of the present invention. Many other configurations of computer system 710 are possible having more or less components than the computer system depicted in FIG. 7.

In addition, while the present invention has been described in the context of a fully functioning data processing system, those of ordinary skill in the art will appreciate that the processes herein are capable of being distributed in the form of a computer readable medium of instructions and data and that the invention applies equally regardless of the particular type of signal bearing media actually used to carry out the distribution. As used herein, a computer readable medium is one on which information can be stored and read by a computer system. Examples include a floppy disk, a hard disk drive, a RAM, a CD, a DVD, flash memory, a USB drive, and so on. The computer readable medium may store information in coded formats that are decoded for actual use in a particular data processing system. A single computer readable medium, as the term is used herein, may also include more than one physical item, such as a plurality of CD ROMs or a plurality of segments of RAM, or a combination of several different kinds of media. As used herein, the term does not include mere time-varying signals in which the information is encoded in the way the signal varies over time.

As used herein, a given value is "responsive" to a predecessor value if the predecessor value influenced the given value. If there is an intervening processing element, step or time period, the given value can still be "responsive" to the predecessor value. If the intervening processing element or step combines more than one value, the signal output of the processing element or step is considered "responsive" to each of the value inputs. If the given value is the same as the predecessor value, this is merely a degenerate case in which the given value is still considered to be "responsive" to the predecessor value. "Dependency" of a given value upon another value is defined similarly.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description, it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A method for evaluating conducting structures in an integrated circuit, the method comprising:

accessing, by a computer system, locations for a plurality of conducting structures in a three-dimensional circuit representation, the plurality of conducting structures including a first conducting structure having a length L in a longitudinal direction;

identifying, by the computer system, in the first conducting structure a plurality of longitudinally adjacent volume elements of the first conducting structure;

estimating, by the computer system, for each volume element n in the plurality of volume elements, a resistivity for the volume element n, wherein resistivity of a volume element n is a function $f(L, W_n, H_n)$, the function being dependent upon the length L of the first conducting structure and a width estimate $W_n$ of the volume element n and a height estimate $H_n$ of the volume element n;

estimating, by the computer system, a resistance of the first conducting structure in dependence upon a resistivity $\rho_n$ for each volume element n in the plurality of volume elements;

writing the resistance of the first conducting structure into a storage device; and applying the resistance to produce an evaluation of the first conducting structure in the integrated circuit.

2. The method of claim 1, wherein the estimating a resistance of the first conducting structure in dependence upon a resistivity $\rho_n$ for each volume element n in the plurality of volume elements comprises estimating a single resistivity $\rho_n$ for the entire volume element n.

3. The method of claim 1, wherein the conductive structure comprises a core material, and wherein a resistivity $\rho_n$ of the volume element n is given by:

$$\rho_n = \max((\beta L^\alpha + \beta W_n^\alpha + \beta H_n^\alpha), \rho_{bulk}),$$

where $\beta$ and $\alpha$ are material dependent parameters and $\rho_{bulk}$ is a bulk resistivity of the core material of the first conducting structure, the material dependent parameters $\beta$ and $\alpha$ being dependent upon the core material.

4. The method of claim 3, wherein the core material of the first conducting structure is sheathed by a second material of the first conducting structure, and the material dependent parameters $\beta$ and $\alpha$ are further dependent upon the second material.

5. The method of claim 3, wherein the material dependent parameters $\beta$ and $\alpha$ are further dependent upon a fabrication process of the first conducting structure.

6. The method of claim 3, wherein estimating the resistance of the first conducting structure in dependence upon a resistivity $\rho_n$ for each volume element n in the plurality of volume elements, comprises:

estimating a local electric potential $\mu_n$ for each volume element n in the plurality of volume elements in dependence upon a resistivity $\rho_n$ of the volume element n by Laplace's equation:

$$\nabla(1/\rho_n) \cdot \nabla\mu_n = 0$$

where a local electric potential $\mu_n$ of a first set of volume elements bounded by a first cross-section $S_A$ of the first conducting structure is a first voltage $V_A$ and a local electric potential $\mu_n$ of a second set of volume elements bounded by a second cross-section $S_B$ of the first conducting structure is a second voltage $V_B$, the second voltage $V_B$ being different from the first voltage $V_A$, $S_A$ and $S_B$ being at opposite ends of the first conducting structure longitudinally;

estimating current I through the first cross-section $S_A$ in dependence upon a resistivity $\rho_m$ and the local electric potential $\mu_m$ of each volume element m in the first set of volume elements by the following equation:

$$I = \int_m (1/\rho_m) D\mu_m dS_A; \text{ and}$$

estimating the resistance of the first conducting structure in dependence upon the current I and a difference between the first voltage $V_A$ and the second voltage $V_B$.

7. A method for estimating resistance in a conducting structure having a length L in a longitudinal direction, the method comprising:

identifying in the conducting structure a plurality of longitudinally adjacent volume elements of the conducting structure;

for each volume element n in the plurality of volume elements in the conducting structure, estimating, by the computer system, a width $W_n$ and a height $H_n$ of the volume element n;

for each of the volume elements n in the plurality of volume elements, estimating, by the computer system, a resistivity $\rho_n$ for the volume element, wherein resistivity $\rho_n$ of the volume element n is a function of the length L of the conducting structure and the width $W_n$ and height $H_n$ of the volume element n; and estimating, by the computer system, a resistance of the conducting structure in dependence upon a resistivity $\rho_n$ for each of the volume elements n in the plurality of volume elements.

8. A system for evaluating conducting structures in an integrated circuit, the system comprising a memory and a data processor coupled to the memory, the data processor configured with:

a source of locations for a plurality of conducting structures in a three-dimensional circuit representation, the plurality of conducting structures including a first conducting structure having a length L in a longitudinal direction;

a volume element identifier;

a dimension estimator;

a volume element resistivity estimator;

a conducting structure resistance estimator; and a flow controller which is programmed to:

operate the volume element identifier to identify in the first conducting structure a plurality of longitudinally adjacent volume elements of the first conducting structure;

operate the dimension estimator to estimate, for each volume element n in the plurality of volume elements in the first conducting structure, a width $W_n$ and a height $H_n$ of the volume element n;

operate the volume element resistivity estimator to estimate, for each of the volume elements n in the plurality of volume elements, a resistivity $\rho_n$ for the volume element, wherein resistivity $\rho_n$ of the volume element n is a function $f(L, W_n, H_n)$, the function being dependent upon the length L of the first conducting structure and the width $W_n$ and height $H_n$ of the volume element n;

operate the conducting structure resistance estimator to estimate a resistance of the first conducting structure in dependence upon a resistivity $\rho_n$ for each of the volume elements n in the plurality of volume elements;

write the resistance of the first conducting structure into a storage device; and apply the resistance to produce an evaluation of the first conducting structure in the integrated circuit.

9. The system of claim 8, wherein the conducting structure resistance estimator to estimate a resistance of the first conducting structure in dependence upon a resistivity $\rho_n$ for each volume element n in the plurality of volume elements comprises estimating a single resistivity $\rho_n$ for the entire volume element n.

10. The system of claim 8, wherein the conductive structure comprises a core material, and wherein resistivity $\rho_n$ of the volume element n is given by $$\rho_n = \max((\beta^\alpha + \beta W_n^\alpha + \beta H_n^\alpha), \rho_{bulk}),$$

where $\beta$ and $\alpha$ are material dependent parameters and $\rho_{bulk}$ is a bulk resistivity of the core material of the first conducting structure, the material dependent parameters $\beta$ and $\alpha$ being dependent upon the core material.

11. The system of claim 10, wherein the core material of the first conducting structure is sheathed by a second material of the first conducting structure, and the material dependent parameters $\beta$ and $\alpha$ are further dependent upon the second material.

12. The system of claim 10, wherein the material dependent parameters $\beta$ and $\alpha$ are further dependent upon a fabrication process of the first conducting structure.

13. The system of claim 10, wherein in estimating the resistance of the first conducting structure in dependence upon a resistivity $\rho_n$ for each volume element n in the plurality of volume elements, the system:

estimates a local electric potential $\mu_n$ for each volume element n in the plurality of volume elements in dependence upon a resistivity $\rho_n$ of the volume element n by Laplace's equation:

$$\nabla(1/\rho_n) \cdot \nabla \mu_n = 0$$

where a local electric potential $\mu_n$ of a first set of volume elements bounded by a first cross-section $S_A$ of the first conducting structure is a first voltage $V_A$ and a local electric potential $\mu_n$ of a second set of volume elements bounded by a second cross-section $S_B$ of the first conducting structure is a second voltage $V_B$, the second voltage $V_B$ being different from the first voltage $V_A$, $S_A$ and $S_B$ being at opposite ends of the first conducting structure longitudinally;

estimates current I through the first cross-section $S_A$ in dependence upon a resistivity $\rho_m$ and the local electric potential of each volume element m in the first set of volume elements by the following equation:

$$I = \int_m (1/\rho_m) \nabla \mu_m dS_A; \text{ and}$$

estimates the resistance of the first conducting structure in dependence upon the current I and a difference between the first voltage $V_A$ and the second voltage $V_B$.

14. A non-transitory computer readable medium having stored thereon a plurality of instructions which when executed by a processor evaluates conducting structures of arbitrary shapes in an integrated circuit, the plurality of instructions comprising instructions that cause the processor to:

identify, in a three-dimensional circuit representation, locations for a plurality of conducting structures the plurality of conducting structures including a first conducting structure, the first conducting structure having a length L in a longitudinal direction;

identify in the first conducting structure a plurality of longitudinally adjacent volume elements of the first conducting structure;

estimate, for each volume element n in the plurality of volume elements in the first conducting structure, a width $W_n$ and a height $H_n$ of the volume element n;

estimate, for each of the volume elements n in the plurality of volume elements, a resistivity $\rho_n$ for the volume element, wherein resistivity $\rho_n$ of the volume element n is a function $f(L, W_n, H_n)$, the function being dependent upon the length L of the first conducting structure and the width $W_n$ and height $H_n$ of the volume element n;

estimate a resistance of the first conducting structure in dependence upon a resistivity $\rho_n$ for each of the volume elements n in the plurality of volume elements;

write the resistance of the first conducting structure into a storage device; and apply the resistance to produce an evaluation of the first conducting structure in the integrated circuit.

15. The non-transitory computer readable medium of claim 14, wherein the estimate a resistance of the first conducting structure in dependence upon a resistivity $\rho_n$ for each volume element n in the plurality of volume elements comprises estimating a single resistivity $\rho_n$ for the entire volume element n.

16. The non-transitory computer readable medium of claim 14, wherein the conductive structure comprises a core material, and wherein resistivity $\rho_n$ of the volume element n is given by:

$$\rho_n = \max((\beta L^\alpha + \beta W_n^\alpha + \beta H_n^\alpha), \rho_{bulk}),$$

where $\beta$ and $\alpha$ are material dependent parameters and $\rho_{bulk}$ is a bulk resistivity of the core material of the first conducting structure, the material dependent parameters $\beta$ and $\alpha$ being dependent upon the core material.

17. The non-transitory computer readable medium of claim 16, wherein the core material of the first conducting structure is sheathed by a second material of the first conducting structure, and the material dependent parameters $\beta$ and $\alpha$ are further dependent upon the second material.

18. The non-transitory computer readable medium of claim 16, wherein the material dependent parameters $\beta$ and $\alpha$ are further dependent upon a fabrication process of the first conducting structure.

19. The non-transitory computer readable medium of claim 16, wherein estimating the resistance of the first conducting structure in dependence upon a resistivity $\rho_n$ for each volume element n in the plurality of volume elements, comprises:

estimating a local electric potential $\mu_n$ for each volume element n in the plurality of volume elements in dependence upon a resistivity $\rho_n$ of the volume element n by Laplace's equation:

$$\nabla(1/\rho_n) \cdot \nabla \mu_n = 0$$

where a local electric potential $\mu_n$ of a first set of volume elements bounded by a first cross-section $S_A$ of the first conducting structure is a first voltage $V_A$ and a local electric potential $\mu_n$ of a second set of volume elements bounded by a second cross-section $S_B$ of the first conducting structure is a second voltage $V_B$, the second voltage $V_B$ being different from the first voltage $V_A$, $S_A$ and $S_B$ being at opposite ends of the first conducting structure longitudinally;

estimating current I through the first cross-section $S_A$ in dependence upon a resistivity $\rho_m$ and the local electric potential of each volume element m in the first set of volume elements, wherein $I = \int_m (1/\rho_m) \nabla \mu_m dS_A$; and estimating the resistance of the first conducting structure in dependence upon the current I and a difference between the first voltage $V_A$ and the second voltage $V_B$.

* * * * *